US006987056B2

(12) United States Patent
Lim et al.

(10) Patent No.: US 6,987,056 B2
(45) Date of Patent: Jan. 17, 2006

(54) METHOD OF FORMING GATES IN SEMICONDUCTOR DEVICES

(75) Inventors: Kwan Yong Lim, Suwon-Shi (KR); Heung Jae Cho, Euiwang-Shi (KR); Tae Hang Ahn, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 3 days.

(21) Appl. No.: 10/615,478

(22) Filed: Jul. 8, 2003

(65) Prior Publication Data

US 2005/0009281 A1    Jan. 13, 2005

(51) Int. Cl.
*H01L 21/3205* (2006.01)
*H01L 21/4763* (2006.01)
(52) U.S. Cl. .................. 438/585; 438/595; 438/772
(58) Field of Classification Search ......... 438/287, 438/303, 385, 585, 595, 772
See application file for complete search history.

(56) References Cited

U.S. PATENT DOCUMENTS 5,412,246 A * 5/1995 Dobuzinsky et al. ....... 257/632
6,274,429 B1 * 8/2001 Misra ......................... 438/257
6,297,172 B1 * 10/2001 Kashiwagi .................. 438/773
6,320,238 B1 * 11/2001 Kizilyalli et al. ........... 257/410
6,720,630 B2 * 4/2004 Mandelman et al. ....... 257/406
6,746,925 B1 * 6/2004 Lin et al. .................... 438/287
2002/0053711 A1 * 5/2002 Chau et al. ................. 257/412

FOREIGN PATENT DOCUMENTS

KR    1999-46953    7/1999

OTHER PUBLICATIONS

Wolf and Tauber, "Silicon processing For The VLSI Era", vol. 1, p. 520, Lattice Press (1986).*
Office Action from Korean Intellectual Property Office dated Mar. 16, 2005.

* cited by examiner

*Primary Examiner*—Asok Kumar Sarkar
(74) *Attorney, Agent, or Firm*—Marshall, Gerstein & Borun LLP

(57) ABSTRACT

Disclosed is the method of forming the gate in the semiconductor device. The present method can prevent abnormal oxidization and lifting at the interface of the stack gate consisting of polysilicon and a metal and can be applied to even the single metal gate, by replacing a re-oxidization process for recovering damage of the gate oxide film generated in the gate patterning process with the oxygen plasma treatment.

12 Claims, 1 Drawing Sheet

METHOD OF FORMING GATES IN SEMICONDUCTOR DEVICES

BACKGROUND

1. Technical Field

A method of forming a gate in a semiconductor device, is disclosed which can prevent abnormal oxidization and lifting at an interface of the stack gate which comprises polysilicon and a metal. The disclosed method can be applied to even the single metal gate, by replacing a re-oxidization process for reducing damage to the gate oxide film generated during the gate patterning process with an oxygen plasma treatment.

2. Background of the Related Art

In the conventional process of forming a gate electrode using a polysilicon film, a re-oxidization process is performed for the purpose of reducing micro-trench damage occurring in the gate oxide film when the polysilicon film is etched and for increasing the device reliability by oxidizing the electrode material remaining in the semiconductor substrate and increasing the thickness of the gate oxide film at the gate edge. It is important to perform the re-oxidization process since the thickness and film quality of the gate oxide film at the gate edge significantly influences hot carrier properties, sub-threshold properties (off-leakage, GIIDL, etc.), punch-through properties, the operation speed of the device, reliability, and the like.

In recent years, in order to lower the resistance of the gate, the polysilicon film and the metal film are stacked to form the gate. The stack structure of the polysilicon film and the metal film, however, has such problems as rapid dimension expansion; or an increase in the surface resistance, or related problems caused during a subsequent high temperature annealing process or the oxidization process. In particular, the most significant problem in the process is that lifting occurs since the metal film is oxidized in a given oxidization atmosphere. A new process that was developed in order to overcome this problem is the selective oxidization process. In other words, in the selective oxidation process, the metal film is not oxidized but only the polysilicon film and the semiconductor substrate are oxidized, in a hydrogen ($H_2$) rich oxidization atmosphere. However, the current selective oxidization process has a problem in that it is possible when the tungsten film or the tungsten nitride film is used as the metal gate electrode. Further, as this oxidization process is possible in the $H_2$ rich atmosphere and at a very high temperature of 700° C., it may have influence on the characteristic of the MOSFET device.

SUMMARY OF THE DISCLOSURE

Accordingly, in view of the above problems, a method of forming the gate in the semiconductor device is disclosed which is capable of stably improving the operational characteristic by preventing oxidization at the interface of the polysilicon film and the metal film in the re-oxidization process.

A method of forming the gate in the semiconductor device is disclosed wherein the oxidization process implemented at low temperature can be applied even to the single gate of the metal film as well as the stack gate of the polysilicon film and the metal film, while preventing abnormal oxidization or the lift phenomenon from being generated.

In the case where the prior art re-oxidization process is performed using high temperature annealing at oxygen or $H_2O$ atmosphere, oxygen that is diffused through the grain boundary and the bulk as well as the surface of the metal film due to very high temperature can oxidize the inside of the metal film and the interface of the polysilicon film and the metal film. For this reason, abnormal oxidization, lifting, and the like may occur. If the plasma oxidization process is performed at low temperature in lieu of high temperature annealing of the oxygen atmosphere, there is an advantage that only the surface of the stack gate of the polysilicon film and the metal film can be re-oxidized. Further, if high temperature annealing is implemented at nitrogen or hydrogen atmosphere after oxygen plasma treatment, the surface oxide film having much better characteristic can be obtained. Furthermore, this method can be applied irrespective of the type of the metal.

Therefore, a method of forming the gate in the semiconductor device is disclosed, which comprises forming a gate pattern on which a gate oxide film and a conductive layer are stacked at a give region on a semiconductor substrate, performing oxygen plasma treatment to form oxide films at the sides of the conductive layer, and performing an annealing process for improving the film quality of the oxide film.

BRIEF DESCRIPTION OF THE DRAWINGS

The above and other features and advantages of the disclosed methods will be apparent from the following detailed description of the preferred embodiments in conjunction with the accompanying drawings, wherein.

DETAILED DESCRIPTION OF THE PREFERRED EMBODIMENT

Figure 1A:
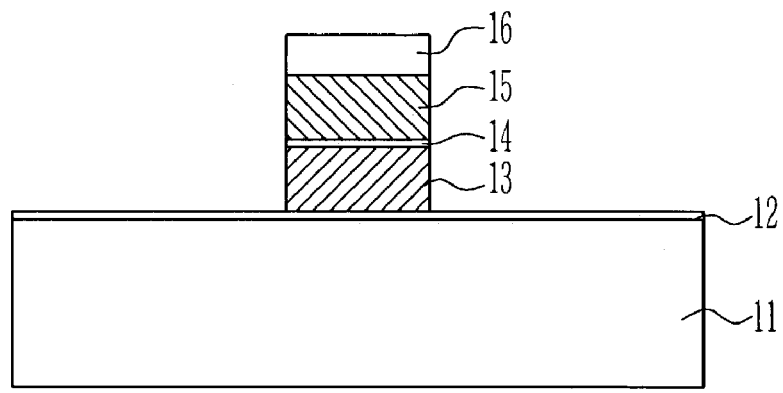
FIG. 1A through FIG. 1C are cross-sectional views of semiconductor devices for illustrating the disclosed methods of forming a gate in a semiconductor device according to this disclosure.
Figure 1B:
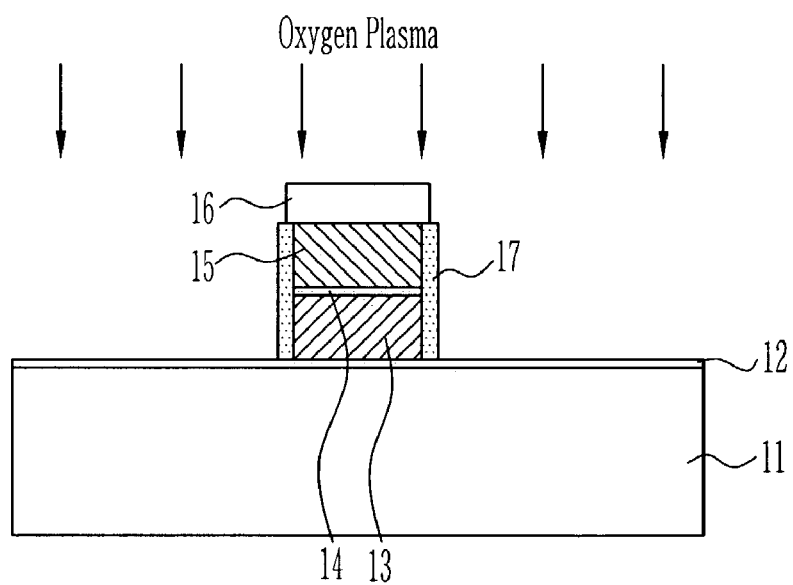
Figure 1C:
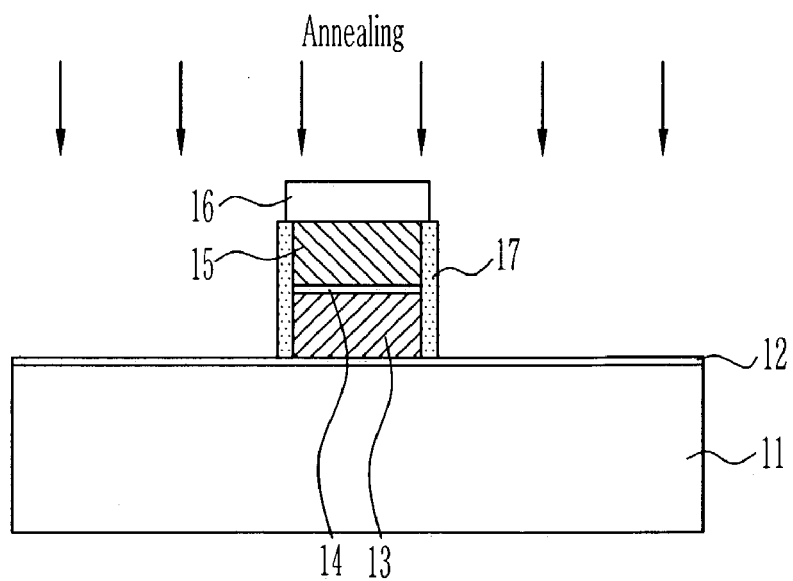

Reference will now be made in detail to at least one preferred embodiment examples of which are illustrated in the accompanying drawings FIG. 1A through FIG. 1C are cross-sectional views of semiconductor devices illustrating the disclosed methods.

Referring to FIG. 1A, a gate oxide film 12 and a polysilicon film 13 are formed on a semiconductor substrate 11. In order to remove a native oxide film formed on the polysilicon film 13 in the process of forming the polysilicon film 13, a cleaning process using a solution containing HF is performed. Next, an anti-diffusion film 14, a metal film 15 and a hard mask 16 are sequentially formed on the entire top surface. The hard mask 16, the metal film 15, the anti-diffusion film 14 and the polysilicon film 13 are then patterned by means of the mask process and the etch process, thus forming a gate pattern.

In the above, the gate oxide film 12 is formed using a silicon oxide film such as $SiO_2$, $SiO_xN_y$, etc. or high-dielectric metal oxide containing Hf or Zr such as $Hf_2$, $ZrO_2$, Hf—Al—O, Zr—Al—O, Hf-silicate, Zr-silicate, and the like. Further, the polysilicon film 13 is formed using a doped polysilicon film. Also, the anti-diffusion film 14 may be formed using $WN_x$, the stack film of W and $WN_x$, the stack gate of $WSi_x$ and $WN*_x$, $TaSi_xN_y$ or $TiAl_xN_y$, wherein x and y have a value of 0.03☐3.00. Furthermore, the metal film 15 may be selectively formed using W, Ta, TaN, Ti or TiN. Meanwhile, it is preferred that the anti-diffusion film 14 and the metal film 15 are formed using the same series of materials in order to simplify the process. If the anti-diffusion film 14 is formed using $WN_x$, the stack film of W and $WN_x$ or the stack film of $WSi_x$ and $WN_x$, the metal film 15 is formed using W. If the anti-diffusion film 14 is formed using $TaSi_xN_y$, the metal film 15 is formed using Ta or TaN. If the anti-diffusion film 14 is formed using $TiAl_xN_y$, the metal film 15 is formed using Ti or TiN. Also, the anti-diffusion film 14 is formed in thickness of 10~300 Å and the metal film 15 is formed in thickness of 100~1000 Å.

By reference to FIG. 1B, oxygen plasma treatment is implemented to oxidize the edge portion of the gate oxide film 12, i.e., the sides of the polysilicon film 13, the anti-diffusion film 14 and the metal film 15, thus forming oxide films 17. The oxygen plasma treatment is performed by applying the RF source power of 100~3000 W and the RF bias power of 0~100 W. Further, the oxygen source for the oxygen plasma treatment may include a gas containing oxygen such as $O_2$, $O_3$, $N_2O$, NO, $H_2O$, or the like, or a mixture of them. Also, the oxygen plasma treatment is implemented using both oxygen and hydrogen as a plasma source. In order to use oxygen and hydrogen as the plasma source together, the flow ratio of oxygen/hydrogen is set to 0.01~0.2. Meanwhile, the oxygen plasma treatment is implemented by setting the temperature of the substrate to be 0~450° C. Upon the oxygen plasma treatment, ultraviolet rays are illuminated on the top of the substrate in order to increase surface oxidization reaction.

With reference to FIG. 1C, in order to improve the characteristic of the oxide film 17 formed by oxygen plasma, annealing is performed at a temperature of 600~1000° C. for 10 seconds~60 minutes nitrogen, hydrogen, argon or vacuum atmosphere that does not contain oxygen.

If the oxygen plasma treatment disclosed here is performed, the edge of the gate oxide film and the surface of the gate are easily oxidized by oxygen radical that is activated by plasma at relative low temperature. As oxidization is not easily diffused since temperature is low, the inside of the gate is not oxidized. This has an advantage that oxidization at the interface of the polysilicon film and the metal film due to the high temperature re-oxidization process or selective oxidization can be prevented. Even in case of the metal gate for which selective oxidization is impossible, the re-oxidization process is possible by using the above method. In another embodiment of the present invention, the gate may be formed using the anti-diffusion film and the metal film without forming the polysilicon film, and the oxidization process may be performed.

As described above, the disclosed techniques have a new effect that they can accomplish a stable operational characteristic of the device by preventing oxidization at the interface of the polysilicon film and the metal film due to the high temperature re-oxidization process or the high temperature selective oxidization process since only the surface of the gate is oxidized. Further, the disclosed methods have an advantage that they can be applied to the gate electrode of various metals since the re-oxidization process is possible by the present method even in case of the metal gate for which selective oxidization is impossible. Therefore, the present invention has a new effect that it can manufacture the single gate MOSFET of the metal film as well as the stack gate of the polysilicon film and the metal film.

The forgoing embodiments are merely exemplary and are not to be construed as limiting the present invention. The present teachings can be readily applied to other types of apparatuses. The description of the disclosed methods is intended to be illustrative, and not to limit the scope of the claims. Many alternatives, modifications, and variations will be apparent to those skilled in the art.

What is claimed is:

1. A method of forming a gate in a semiconductor device, comprising:

forming a gate pattern on a gate oxide film disposed on a semiconductor substrate, the gate pattern including a polysilicon film, an anti-diffusion film stacked on the polysilicon film and a metal film stacked on the anti-diffusion film and the gate pattern being stacked on a given region of the semiconductor substrate, wherein a cleaning process using a HF solution is performed on the polysilicon film before the anti-diffusion film is stacked thereon to remove a native oxide from the polysilicon film, forming a hard mask on top of the gate pattern; and performing an oxygen plasma treatment to a form an oxide film on sides of the conductive layer and not on the hard mask, wherein the oxygen plasma treatment is performed using oxygen and hydrogen with a flow ratio of oxygen: hydrogen being in a range of from 0.01 to 0.2.

2. The method as claimed in claim 1, wherein the gate oxide film is formed using a silicon oxide film or a high-dielectric metal oxide film.

3. The method as claimed in claim 2, wherein the silicon oxide film include $SiO_2$ and $SiO_xN_y$.

4. The method as claimed in claim 2, wherein the high-dielectric metal oxide film includes $HO_2$, $ZrO_2$, Hf—Al—O, Zr—Al—O, Hf-silicate and Zr-silicate.

5. The method as claimed in claim 1, wherein the anti-diffusion film is formed using any one of $WN_x$, a stack film of W and $WN_x$, a stack film of $WSi_x$ and $WN_x$, $TaSi_xN_y$ and $TiAl_xN_y$.

6. The method as claimed in claim 1, wherein the metal film is formed using any one of W, Ta, TaN, Ti and TiN.

7. The method as claimed in claim 1, wherein the oxygen plasma treatment is implemented by applying the RF source power of 100~3000 W and the RF bias power of 0~100 W.

8. The method as claimed in claim 1, wherein the oxygen plasma treatment is implemented in a state where the substrate temperature is 0~450° C.

9. The method as claimed in claim 1, further comprising the step of implementing the oxygen plasma treatment by illuminating ultraviolet rays on the top of the substrate.

10. The method as claimed in claim 1, further comprising the step of performing an annealing process after the oxygen plasma treatment is performed.

11. The method as claimed in claim 10, wherein the annealing process is performed at a temperature of 600~1000° C. For 10 seconds~60 minutes in a nitrogen, hydrogen, argon or vacuum atmosphere.

12. A method of forming a gate in a semiconductor device, comprising the steps of:

forming a gate pattern on a gate oxide film that is disposed on a semiconductor substrate, the gate pattern including a polysilicon film stacked on the gate oxide film, an anti-diffusion film stacked on the polysilicon film, and a metal film stacked on the anti-diffusion film, the gate pattern disposed at a given region of the semiconductor substrate, wherein a cleaning process using a HF solution is performed on the polysilicon film before the anti-diffusion film is stacked thereon to remove a native oxide from the polysilicon film;

forming a hard mask on top of the gate pattern;

performing an oxygen plasma treatment to form oxide films only on sides of the gate pattern and not on the hard mask; wherein the oxygen plasma treatment is performed using oxygen and hydrogen with a flow ratio of oxygen:hydrogen being in a range of from 0.01 to 0.2 and performing an annealing process for improving the film quality of the oxide film.

* * * * *